US011233515B2

(12) United States Patent
Vasquez Lopez et al.

(10) Patent No.: US 11,233,515 B2
(45) Date of Patent: Jan. 25, 2022

(54) SCHEDULING OF TASKS FOR EXECUTION IN PARALLEL BASED ON GEOMETRIC REACH

(71) Applicant: Microsoft Technology Licensing, LLC, Redmond, WA (US)

(72) Inventors: Daniel Vasquez Lopez, Duvall, WA (US); Kenneth Reneris, Kirkland, WA (US); Jason Michael Lee, Savannah, GA (US); Michael B. Goulding, Redmond, WA (US); Paul W. Accisano, Seattle, WA (US); Matus Lipka, Kirkland, WA (US); Jamie Randall Kuesel, Woodinville, WA (US); Srinivas Raghu Gatta, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/887,721

(22) Filed: May 29, 2020

(65) Prior Publication Data

US 2021/0376835 A1   Dec. 2, 2021

(51) Int. Cl.
*H03K 19/195* (2006.01)
*G11C 11/44* (2006.01)
(Continued)

(52) U.S. Cl.
CPC ............ *H03K 19/195* (2013.01); *B82Y 10/00* (2013.01); *G06F 9/485* (2013.01); *G06F 9/4881* (2013.01);
(Continued)

(58) Field of Classification Search
CPC ... H03K 19/195; G06F 30/394; G06F 30/392; G06F 9/52; G06F 9/485; G06F 9/4881; B82Y 10/00; G11C 11/44
See application file for complete search history.

(56) References Cited

U.S. PATENT DOCUMENTS

| 7,587,695 | B2 * | 9/2009 | Petunin | ................. | G06F 30/39 716/137 |
| 8,250,514 | B1 * | 8/2012 | Wadland | ............... | G06F 30/394 716/131 |

(Continued)

OTHER PUBLICATIONS

"International Search Report and Written Opinion Issued in PCT Application No. PCT/US2021/020496", dated Jul. 28, 2021, 15 Pages.

*Primary Examiner* — Nha T Nguyen
(74) *Attorney, Agent, or Firm* — Ranjeev Singh; Singh Law, PLLC

(57) ABSTRACT

Systems and methods related to scheduling of tasks for execution in parallel based on geometric reach are described. An example method includes processing information pertaining to connectivity among superconducting components and nodes included in a shared floor plan to generate a plurality of areas of reach, where each of the plurality of areas of reach corresponds to a portion of the shared floor plan. The method further includes generating a plurality of inflated areas of reach by inflating each of the plurality of areas of reach based on a target inductance of wires for routing signals among the superconducting components and the nodes included in the shared floor plan. The method further includes scheduling parallel execution of tasks for routing wires among a subset of the superconducting components and the nodes within any of the plurality of inflated areas of reach satisfying a geometric constraint.

20 Claims, 13 Drawing Sheets

(51) Int. Cl.

| | | |
|---|---|---|
| *G06F 9/48* | (2006.01) | |
| *G06F 9/52* | (2006.01) | |
| *B82Y 10/00* | (2011.01) | |
| *G06F 30/392* | (2020.01) | |
| *G06F 30/394* | (2020.01) | |

(52) U.S. Cl.
CPC .............. *G06F 9/52* (2013.01); *G06F 30/392* (2020.01); *G06F 30/394* (2020.01); *G11C 11/44* (2013.01)

(56) References Cited

U.S. PATENT DOCUMENTS

| | | | | |
|---|---|---|---|---|
| 8,370,783 | B2 * | 2/2013 | Uchino | G06F 30/394 716/131 |
| 8,930,869 | B2 * | 1/2015 | Ohtsuka | G06F 30/394 716/126 |
| 10,592,814 | B2 * | 3/2020 | Shao | H01L 39/2493 |
| 10,599,805 | B2 * | 3/2020 | Shao | G06F 30/33 |
| 2005/0224784 | A1 * | 10/2005 | Amin | B82Y 10/00 257/14 |
| 2008/0034342 | A1 * | 2/2008 | Petunin | G06F 30/394 716/126 |
| 2011/0055784 | A1 | 3/2011 | Gao et al. | |
| 2011/0246955 | A1 * | 10/2011 | Ohtsuka | G06F 30/394 716/112 |
| 2016/0034609 | A1 * | 2/2016 | Herr | G06F 30/394 716/104 |
| 2018/0137428 | A1 * | 5/2018 | Abdo | G06N 10/00 |
| 2019/0108303 | A1 | 4/2019 | Betz et al. | |
| 2020/0327269 | A1 * | 10/2020 | Pond | G06N 10/00 |

* cited by examiner

UI BLOCK
110

NETLIST
120

PLACE AND ROUTE ENGINE
130

SUPERCONDUCTING LOGIC LIBRARY
140

PHYSICAL LAYOUT
150

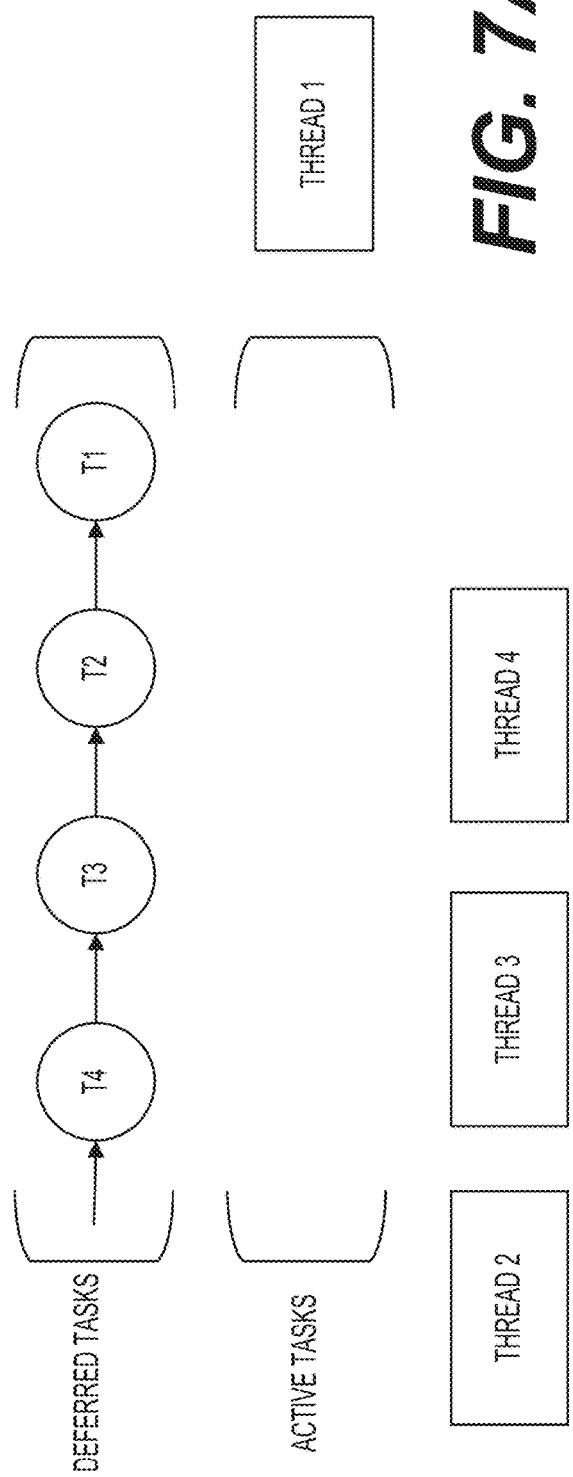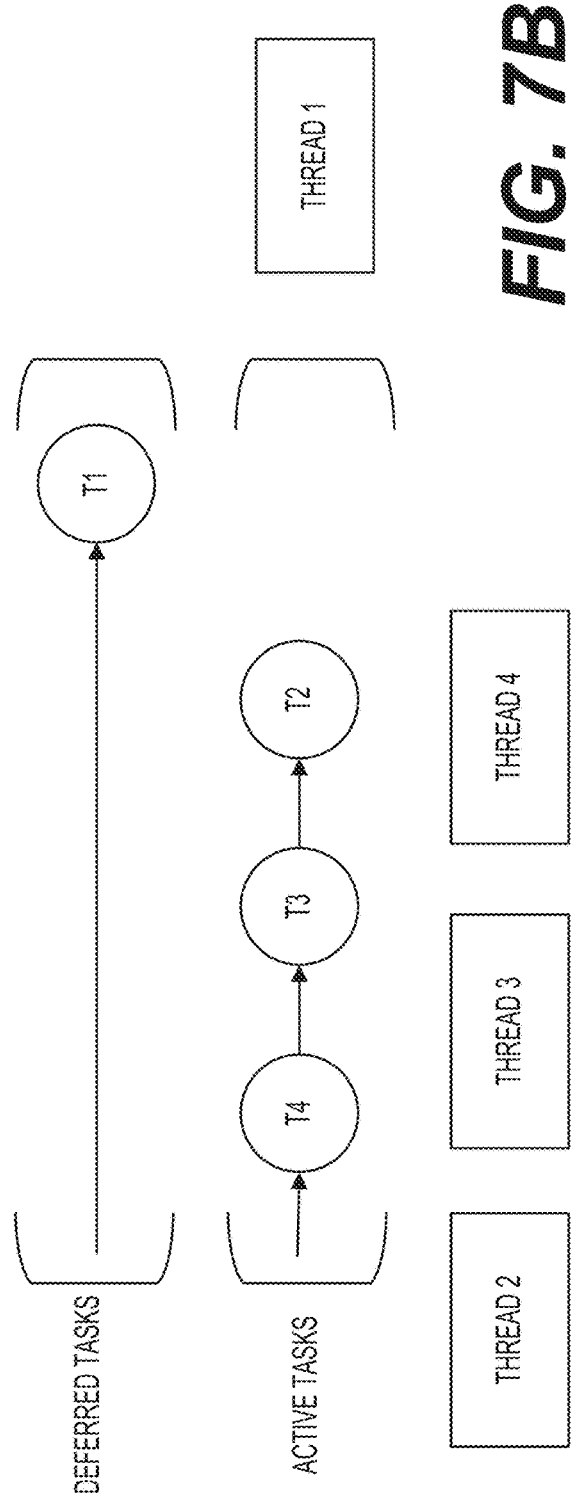

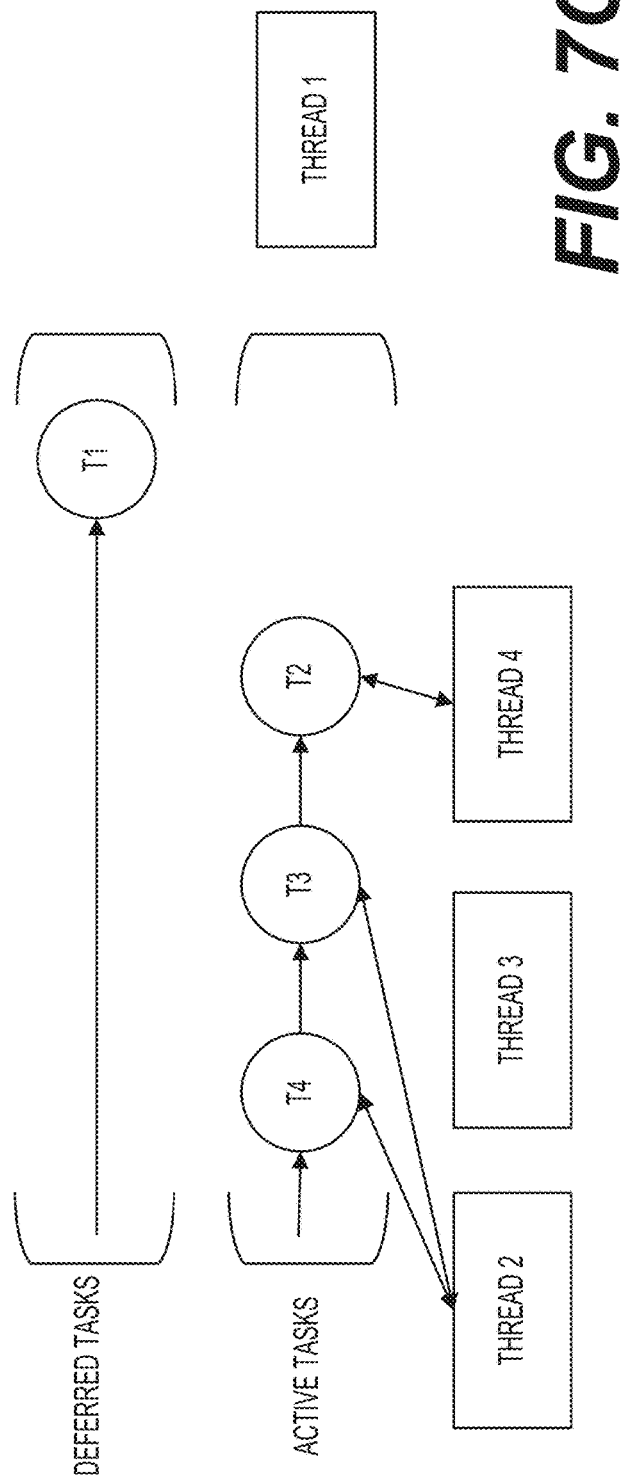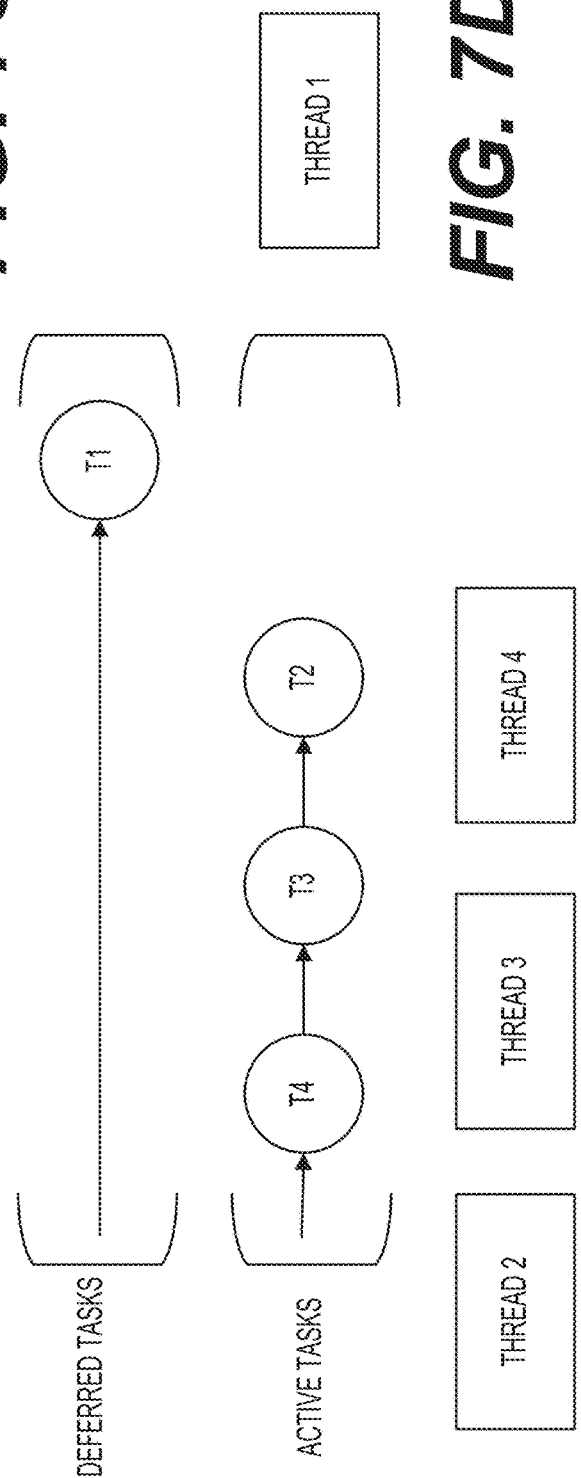

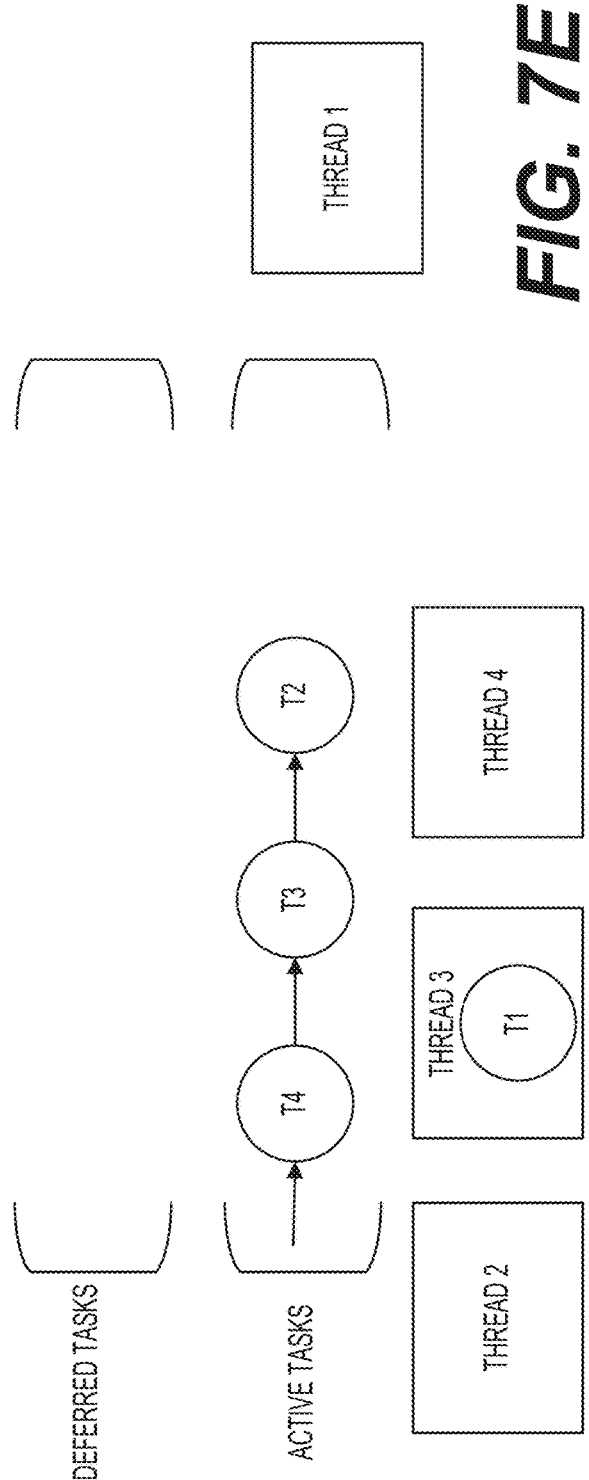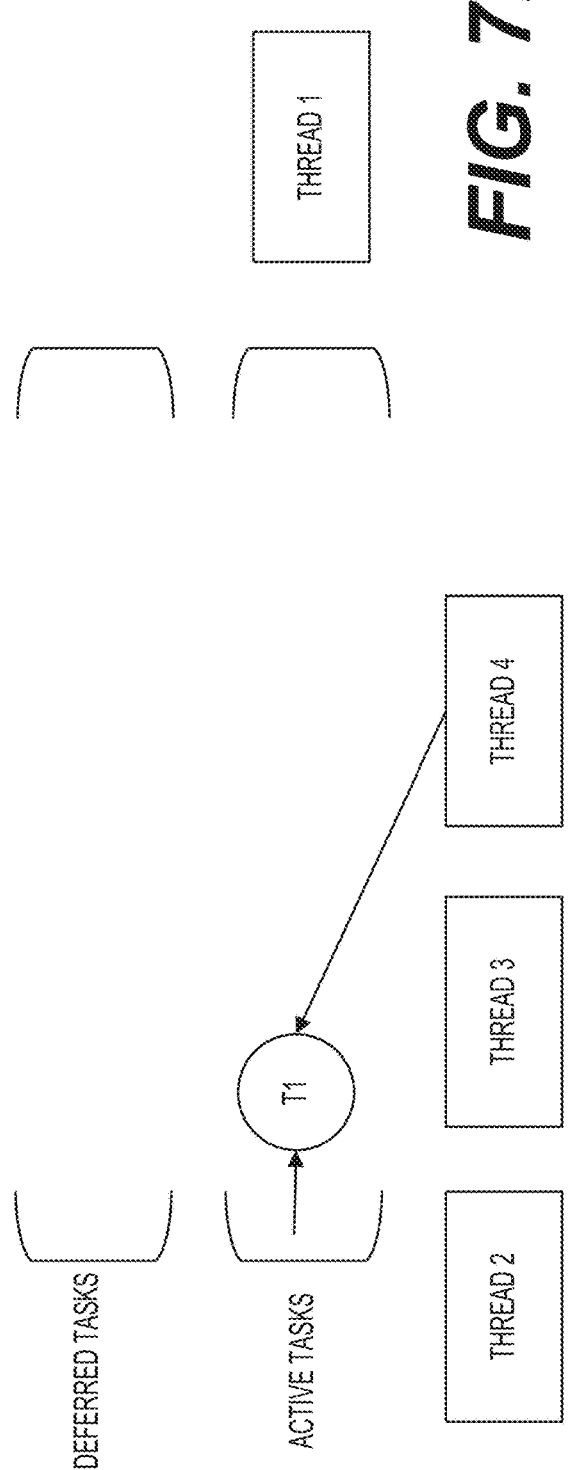

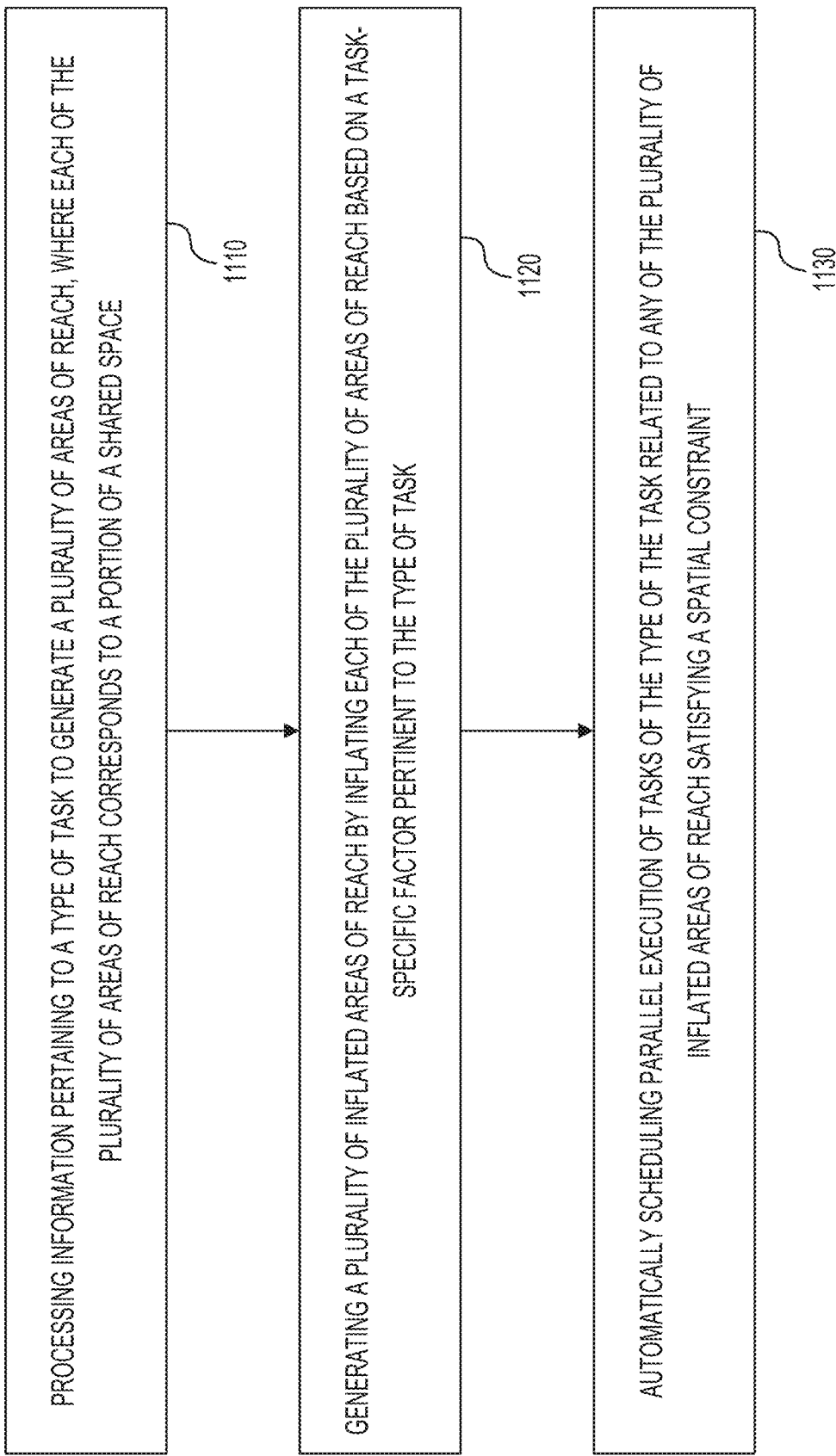

SCHEDULING OF TASKS FOR EXECUTION IN PARALLEL BASED ON GEOMETRIC REACH

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems. As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors.

An additional approach to the use of processors and related components, based on CMOS technology, is the use of superconducting logic-based components and devices. Superconducting logic-based circuits can also be used to process quantum information, such as qubits. Many superconducting logic circuits include inductors and other active elements that can complicate the design of such circuits.

SUMMARY

In one aspect, the present disclosure relates to a method, implemented by a processor, including using the processor, processing information pertaining to connectivity among superconducting components and nodes included in a shared floor plan to generate a plurality of areas of reach, wherein each of the plurality of areas of reach corresponds to a portion of the shared floor plan. The method may further include using the processor, generating a plurality of inflated areas of reach by inflating each of the plurality of areas of reach based on a target inductance of wires for routing signals among the superconducting components and the nodes included in the shared floor plan. The method may further include using the processor, scheduling parallel execution of tasks for routing wires among a subset of the superconducting components and the nodes within any of the plurality of inflated areas of reach satisfying a geometric constraint.

In another aspect, the present disclosure relates to a system comprising a processor and a memory having instructions. The instructions, when executed by the processor, may cause the processor to: (1) process information pertaining to a type of task to generate a plurality of areas of reach, wherein each of the plurality of areas of reach corresponds to a portion of a shared space; (2) generate a plurality of inflated areas of reach by inflating each of the plurality of areas of reach based on a task-specific factor pertinent to the type of task; and (3) automatically schedule parallel execution of tasks of the type of the task related to any of the plurality of inflated areas of reach satisfying a spatial constraint.

In yet another aspect, the present disclosure relates to a method, implemented by a processor, for use with a set of wires for routing signals as part of a superconducting circuit design. The method may further include using the processor, processing information pertaining to the set of wires to generate a plurality of areas of reach. The method may further include using the processor, generating a plurality of inflated areas of reach by inflating each of the plurality of areas of reach based on a target inductance of the set of wires. The method may further include using the processor, automatically scheduling parallel execution of tasks for routing wires related to any of the plurality of inflated areas of reach satisfying a geometric constraint.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 1 is a block diagram of a system environment n accordance with one example;

FIGS. 7A-7F show an example of scheduling of place and route tasks based on the inflated areas of reach in accordance with one example;

FIG. 11 is a flow chart of a method for scheduling tasks in parallel based on geometric reach in accordance with one example.

DETAILED DESCRIPTION

Figure 2:
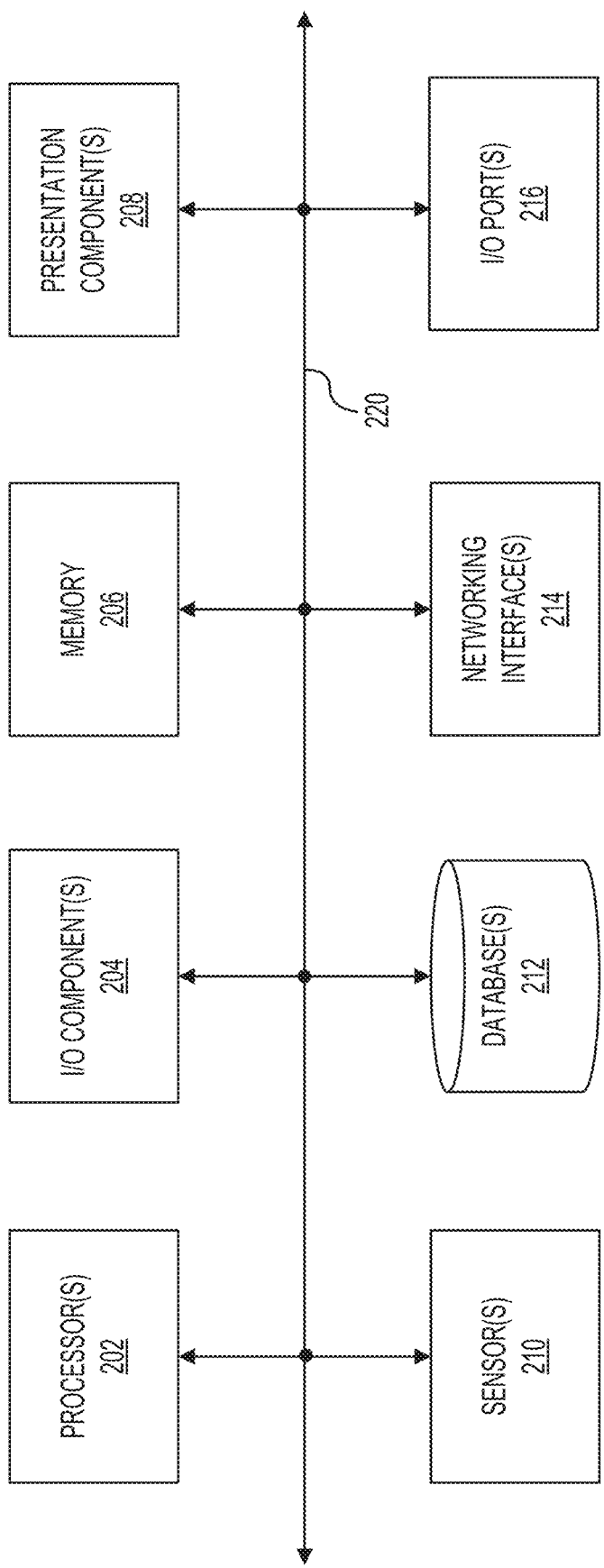
FIG. 2 shows a computing platform that may be used to implement the functions associated with the system environment of FIG. 1 in accordance with one example.

Examples described in this disclosure relate to scheduling of tasks for execution in parallel based on geometric reach. Certain examples relate to scheduling of tasks related to the routing of wires as part of the design of an integrated circuit. In certain examples, the geometric reach relates to the maximum inductance reach of zero-resistance wires used to interconnect superconducting components.

Superconducting logic-based circuits require superconducting logic that is different in many aspects from semiconducting logic-based circuits (e.g., CMOS circuits). As an example, unlike semiconducting logic-based circuits, superconducting logic-based circuits use zero-resistance wires. Wires without resistance exhibit different challenges such as being susceptible to magnetic fields. Zero-resistance wires are passive components that may be used to connect multiple logic components in a superconducting circuit. Zero-resistance wires may have a target inductance. In one example, the target inductance may be the specific length that the wires may need to have in order to be within error tolerance to work properly. This aspect of zero-resistance wires is different from the wire used in semiconducting logic, where the wires need to be as short as possible.

Unlike signals propagated in semiconducting logic-based circuits, signals (e.g., microwave signals) travel much faster over superconducting wires. Accordingly, the primary constraint associated with the routing of the wires is not timing, but other properties of the wire, such as the inductance of the wires. This is also because the wires in superconducting circuits act like inductors with respect to the signals being propagated, and thus they need to be sized appropriately. For a superconducting metal, based on its properties, one can determine the maximum reach of an inductor based on the type and the nature of the metal. As an example, assuming certain amount of inductance per nanometer (or some other measure of length), one can calculate how much inductance will accumulate at a certain length of the wire when the wire has the maximum width possible under the design rules associated with a particular library of superconducting components.

A superconducting circuit design may include several routing layers. Each routing layer may be composed of a routing grid. In one example, for every square on the routing grid, the maximum amount of inductance (and the minimum amount of inductance) one can accumulate between nodes or intersections is determined. This way, one can determine, for each routing grid, the amount of inductance that the inductor (e.g., a zero-resistance wire) is allowed to have; and then that amount divided by the minimum inductance per square provides the maximum amount of squares that a particular wire is allowed to travel before it reaches the target inductance.

Computing the path to connect two logic components using zero-resistance wires is compute intensive. The number of zero-resistance wires to route is generally proportional to the integrated circuit complexity. This means that the software that routes the wires needs to scale as the designs get more complex. The components in a circuit design may share global state, such as the floor plan, defined as a matrix of pixels where the components are placed. As an example, a single pixel in a shared floor plan may represent a square of inductor that could be placed and routed in that region. Design rules may further dictate the length of the zero-resistance wire that could be placed and routed in a region of the shared floor plan. In one example, the floor plan may include only those components that will be fabricated as a single layer of an integrated circuit. Alternatively, the floor plan may include components that will be fabricated in different layers of the integrated circuit.

Task scheduling may be performed in an active mode or a passive mode. Active scheduling may include allowing multiple tasks to execute based on the concept of a bounding box with maximum inductance reach. To accomplish such active scheduling efficiently, in one example, it requires an implementation with lock free data structures to avoid unnecessary contention. Finding the tasks that are mutually exclusive can be accomplished by looking at the active list of tasks currently scheduling and then trying to schedule a new task automatically. Passive scheduling relates to when all the tasks requiring scheduling in parallel are known before executing them. In this case, the scheduling can be more sophisticated, such as using a tree data structure with geometric properties to find the set of tasks that are mutually exclusive based on their bounding box with maximum inductance reach. In any case, in one example, tasks are scheduled as long as there is no intersection in terms of the geometric reach of the tasks. In sum, as an example, the scheduling is concerned with publishing the task on an active list, then all of the threads will start stealing work and performing the tasks in parallel. Advantageously, the scheduler described herein ensures that tasks get executed (in parallel) while maintaining almost a hundred-percent usage of the computing resources, such as the computing cores associated with a processor or a multi-processor system.

Superconducting circuits may use Josephson junctions to implement the functionality associated with the circuits. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the superconducting circuits. As an example, superconductors are materials that can carry a direct electrical current (DC) in the absence of an electric field, Superconductors have a critical temperature (Tc) below which they have zero resistance. Niobium, one such superconductor, has a critical temperature (Tc) of 9.3 Kelvin degrees. At temperatures below Tc, niobium is superconductive; however, at temperatures above Tc, it behaves as a normal metal with electrical resistance. Thus, in the SIS type of Josephson junction superconductors may be niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors.

Various superconducting circuits including transmission lines can be formed by coupling multiple Josephson junctions by inductors or other components, as needed. Microwave pulses can travel via these transmission lines under the control of at least one clock. The microwave pulses can be positive or negative, or a combination thereof. The microwave pulses may have a frequency of up to 10 GHz or higher. The clock may also have a frequency up to 10 GHz or higher.

The building blocks of superconducting circuits may include various types of logic gates. Example logic gates include an AND gate, an OR gate, a logical A-and-not-B (AanB) gate and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B goes to output Q1 and the second input pulse goes to output Q2. The logical behavior of these gates may be based on the type of encoding method used for encoding logic values.

Once information pertaining to connectivity among superconducting components and nodes (e.g., as part of a netlist) is accessible, the components and the zero-resistance wires may need to be routed to connect the superconducting components (e.g., logic gates, inverters, bias terminals, flip-flops, and the like) and the nodes. As an example, zero-resistance wires may be used to connect: a node to another node, a node to an input of a component, an output of a component to a node, a layer to another layer, a node to a clock signal, a node to the ground terminal or a power supply terminal.

FIG. 1 is a block diagram of a system environment 100 in accordance with one example. System environment 100 shows example blocks for performing methods and systems related to placement and routing for superconducting circuit design. System environment 100 may include a user interface (UI) block 110, a netlist 120, a place and route engine (PRE) 130, a superconducting logic library 140, and physical layout 150. UI block 110 may include code for enabling a user interface that allows a designer or another user to interact with the system. As an example, UI block 110 may include code and data structures allowing a user to select superconducting logic library 140 or another library. In this example, netlist 120 may include information pertaining to connectivity among superconducting components and nodes. Netlist 120 may include such information for a floor plan for each of the layers of the superconducting circuit design. Netlist 120 may also include connectivity information related to connecting wires to power supply terminals, ground terminals, bias terminals, clock terminals, or other types of terminals.

With continued reference to FIG. 1, PRE 130 may be implemented as a callable set of methods that allow placement and routing of components and wires and the generation of a physical layout for the superconducting circuit design. Superconducting logic library 140 may include information concerning frequency, AC amplitude, and other parameters concerning the type of logic gates that are associated with the design. As an example, the logic gates may correspond to wave pipelined logic gates or phase mode logic gates. In this example, superconducting logic library 140 may include definitions of the logic gates. In one example, superconducting logic library 140 may include Json and Verilog definitions of the logic gates and other superconducting components. As shown in system environment 100, the output of placement and routing may be files corresponding to physical layout 150 of the superconducting circuit being designed. Although FIG. 1 shows certain blocks that are included as part of system environment 100, there may be additional or fewer blocks. As an example, system environment 100 may include a reports block that may be used to generate reports concerning the superconducting circuit design. As another example, system environment 100 may include additional timing libraries that may include similar information that could be used to support superconducting circuits built for operation at different temperatures or superconducting circuits built using different manufacturing processes.

FIG. 2 shows a computing platform 200 that may be used to implement the functions associated with the system environment 100 of FIG. 1 in accordance with one example. Computing platform 200 may include processor(s) 202, I/O component(s) 204, memory 206, presentation component(s) 208, sensor(s) 210, database(s) 212, networking interface(s) 214, and I/O port(s) 216, which may be interconnected via bus 220. Processor(s) 202 may execute instructions or code stored in memory 206. The instructions may correspond to the various modules and algorithms described in the present disclosure. Thus, the modules and algorithms may be implemented using a programming language and compiled into executables, which may then be executed. I/O component(s) 204 may include components such as a keyboard, a mouse, a voice recognition processor, or touch screens. Memory 206 may be any combination of non-volatile storage or volatile storage (e.g., flash memory, DRAM, SRAM, or other types of memories). Presentation component(s) 208 may be any type of display, such as LCD, LED, or other types of display, or other types of output components, including audio or haptic output components. Sensor(s) 210 may include audio sensors, optical sensors, or other types of sensors.

With continued reference to FIG. 2, database(s) 212 may be used to store superconducting design related information, including design libraries, and other design related information. Networking interface(s) 214 may include communication interfaces, such as Ethernet, cellular radio, Bluetooth radio, WAS radio, or other types of wireless or wired communication interfaces. I/O port(s) 216 may allow computing platform 200 to communicate with other external components. Although FIG. 2 shows computing platform 200 as including a certain number of components arranged and coupled in a certain way, it may include fewer or additional components arranged and coupled differently. In addition, the functionality associated with computing platform 200 may be distributed or combined, as needed. Moreover, not all of the aspects of computing platform 200 may be needed to implement the various methods, modules, and algorithms described herein.

Figure 3:
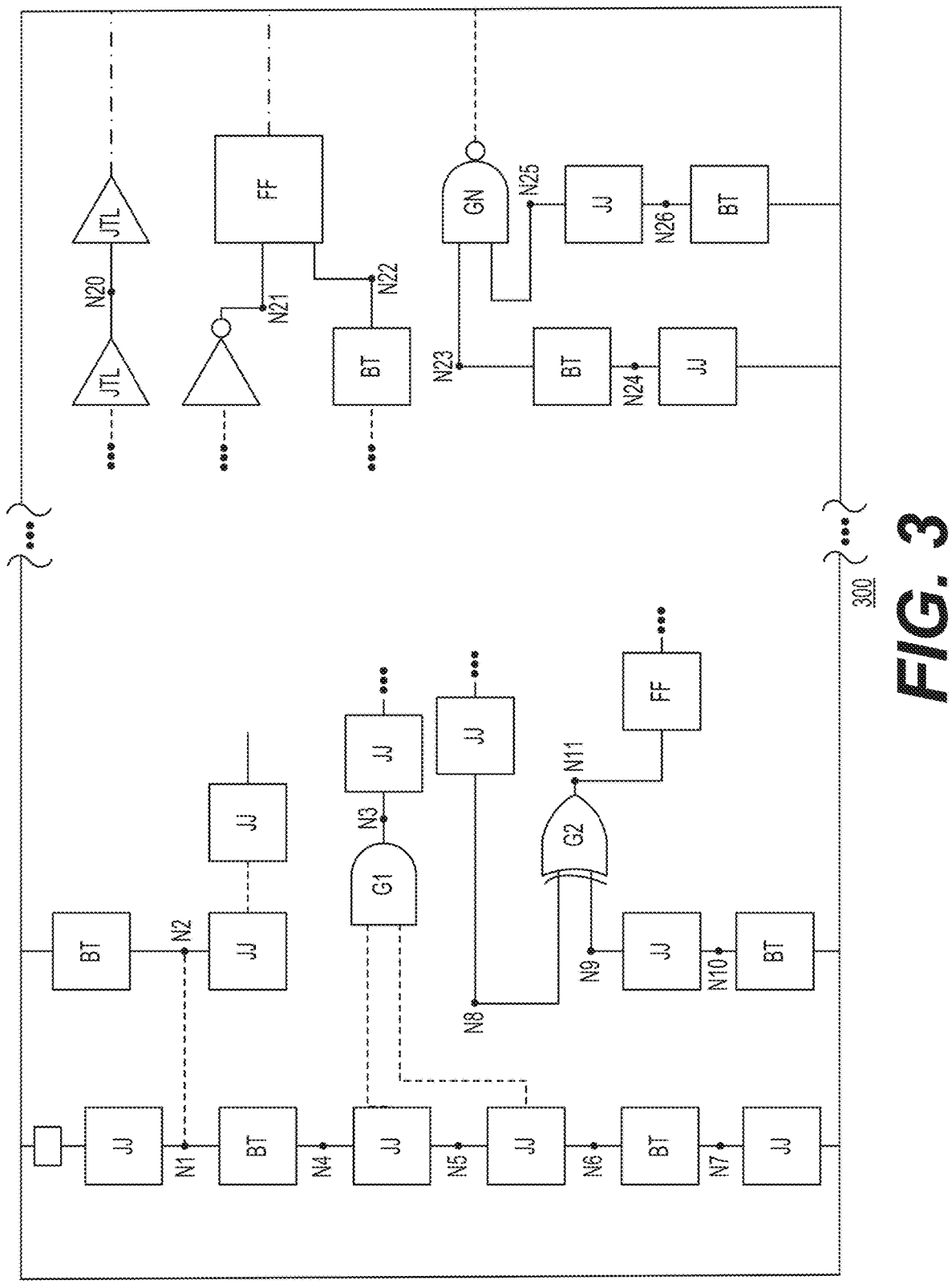
FIG. 3 shows an example floor plan associated with a portion of a superconducting circuit design.

FIG. 3 shows an example floor plan 300 associated with a portion of a superconducting circuit design. In this example, floor plan 300 shows the placement of components and the routing of wires among the components for one layer of a superconducting circuit. The superconducting circuit design may include several layers of components and wires, which may then be used to fabricate an integrated circuit using a foundry. Example layers include a ground layer, a clock signals layer, several gate logic layers, a power distribution layer, and other layers, as needed. The wires interconnecting the various components may be fabricated using a superconducting metal (e.g., niobium) and thus may exhibit zero-resistance. As explained earlier, wires without resistance exhibit different challenges such as being susceptible to magnetic fields and having inductance, Zero-resistance wires are passive components that may be used to connect multiple logic components in a superconducting circuit. Zero-resistance wires may have a target inductance. The target inductance may be the specific length that the wires may need to have in order to be within the error tolerance to work properly.

With continued reference to FIG. 3, floor plan 300 shows various types of components coupled to each other and to other nodes. Example components include, but are not limited to, Josephson junctions (JJs), bias terminals, logic gates (e.g., OR gates, NOR gates, AND gates, NAND gates, AandorB gates), flip-flops, latches, buffers, inverters, and Josephson transmission lines (JTLs). As an example, FIG. 3 shows several nodes (e.g., N1, N2, N3, N4, N5, N6, N7, N8, N9, N10, N11 . . . N20, N21, N22, N23, N24, N25, and N26) that may be coupled to zero-resistance wires. FIG. 3 also shows example JJs and bias terminals (BTs), which may be used for providing DC bias or AC bias to the superconducting circuits. FIG. 3 further shows other types of components that may be included as part of example floor plan 300. In addition, zero-resistance wires may be used to couple power supply lines (e.g., lines carrying AC clock signals, which may be used to power the superconducting components), ground lines, and clock lines. The dotted lines show zero-resistance wires in a layer above or beneath the layer to which floor plan 300 corresponds to. Thus, wires may connect with wires in a different layer using vias or other such structures. Although FIG. 3 shows a specific number and type of components arranged in a certain manner, floor plan 300 for the superconducting circuit design may include additional or fewer components that may be of other types and that may be arranged differently. In addition, floor plan 300 is shown merely to illustrate the various types of components and their arrangements as part of superconducting circuit design using the parallel scheduling of placement and routing tasks.

A place and route tool (e.g., place and route engine 130 of FIG. 1) may generate a physical layout output file with determination of both placement of the various components shown in FIG. 3 and the routing of zero-resistance wires to interconnect these components. The zero-resistance wires may be routed along a horizontal direction and along a vertical direction relative to a floor plan of the circuit being designed. Depending upon the type of logic used to implement the superconducting circuit design and the complexity of the superconducting circuit design, multiple layers may be needed to implement the superconducting circuit design. In one example, each layer may have a corresponding floor plan similar to floor plan 300 of FIG. 3.

Figure 4:
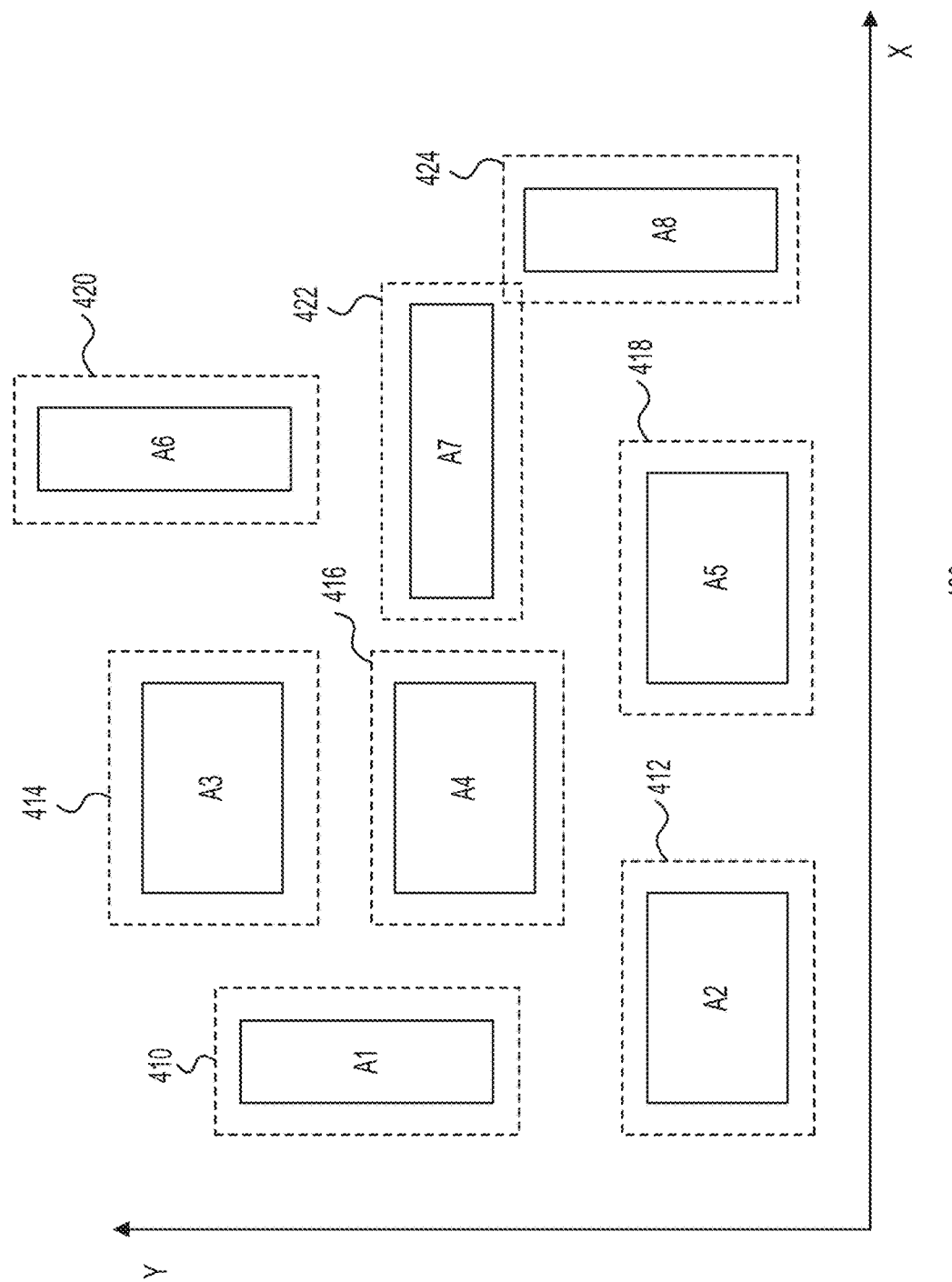
FIG. 4 shows example areas of reach and inflated areas of reach in a shared floor plan in accordance with one example.

FIG. 4 shows example areas of reach and inflated areas of reach in a shared floor plan in accordance with one example. In this example, an inflated area of reach represents the maximum area where a task can have side-effects on a shared floor plan. As an example, shared floor plan 400 shows inflated areas of reach 410, 412, 414, 416, 418, 420, 422, and 424. In the context of the examples described herein, a task is a computational unit that can perform a user-supplied function. For example, a function that routes an inductor from one point to another. In the example described with respect to FIG. 4, the task must be associated with an "area of reach" (e.g., a bounding box). In one example, a bounding box is a rectangle made from two points, for example points P1 and P2. Using the area of reach, a task scheduler may schedule in parallel the execution of tasks that individually do the routing of a zero-resistance wire by using its inductance. For example, two tasks T1 and T2 may be executed in parallel, where the task T1 is scheduled to route a wire from point P1 to point P2 and the task T2 is scheduled to route a wire from point P3 to point P4. In this example, tasks T1 and T2 can be executed in parallel, if and only if, their inflated areas of reach with their respective maximum inductance reach are mutually exclusive.

With continued reference to FIG. 4, in this example, an inflated area of reach (e.g., a bounding box with the maximum inductance reach), is the area of reach (e.g., a bounding box) inflated by a value based on the current maximum reach of the zero-resistance wire's inductance. In one example, the value used to inflate the area of reach may be the target inductance, which in turn may depend upon the type of material (e.g., niobium or some other superconducting metal or alloy) used to form the zero-resistance wires. The target inductance used to inflate the area of reach may also depend on the width and the thickness of the zero-resistance wires. In this example, the target inductance may correspond to a specific length of the zero-resistance wires required for the circuits to work properly. As an example, the target inductance used to inflate the areas of reach may be selected to ensure performance of the circuit within certain error tolerance limit.

Still referring to FIG. 4, the areas of reach that are non-overlapping portions of the shared floor plan are A1, A2, A3, A4, A5, A6, A7, and A8. The inflated areas of reach are 410, 412, 414, 416, 418, 420, 422, and 424. In one example, inflating by a certain value may mean adding padding around the area of reach to inflate it in every direction. As an example, inflated areas (represented by dotted lines) have been expanded in each direction. In this example, only inflated areas of reach 422 and 424 overlap and thus possibly creating side effects during parallel execution of tasks. Although FIG. 4 shows rectangular areas of reach as part of shared floor plan 400, other shapes may also be used to represent the areas of reach. As an example, the areas may have shapes corresponding to a triangle, a square, a circle, an ellipse, or a polygon with any number of sides. In addition, instead of area, volume ay be used to represent the geometric reach in the context of this example.

Figure 5:
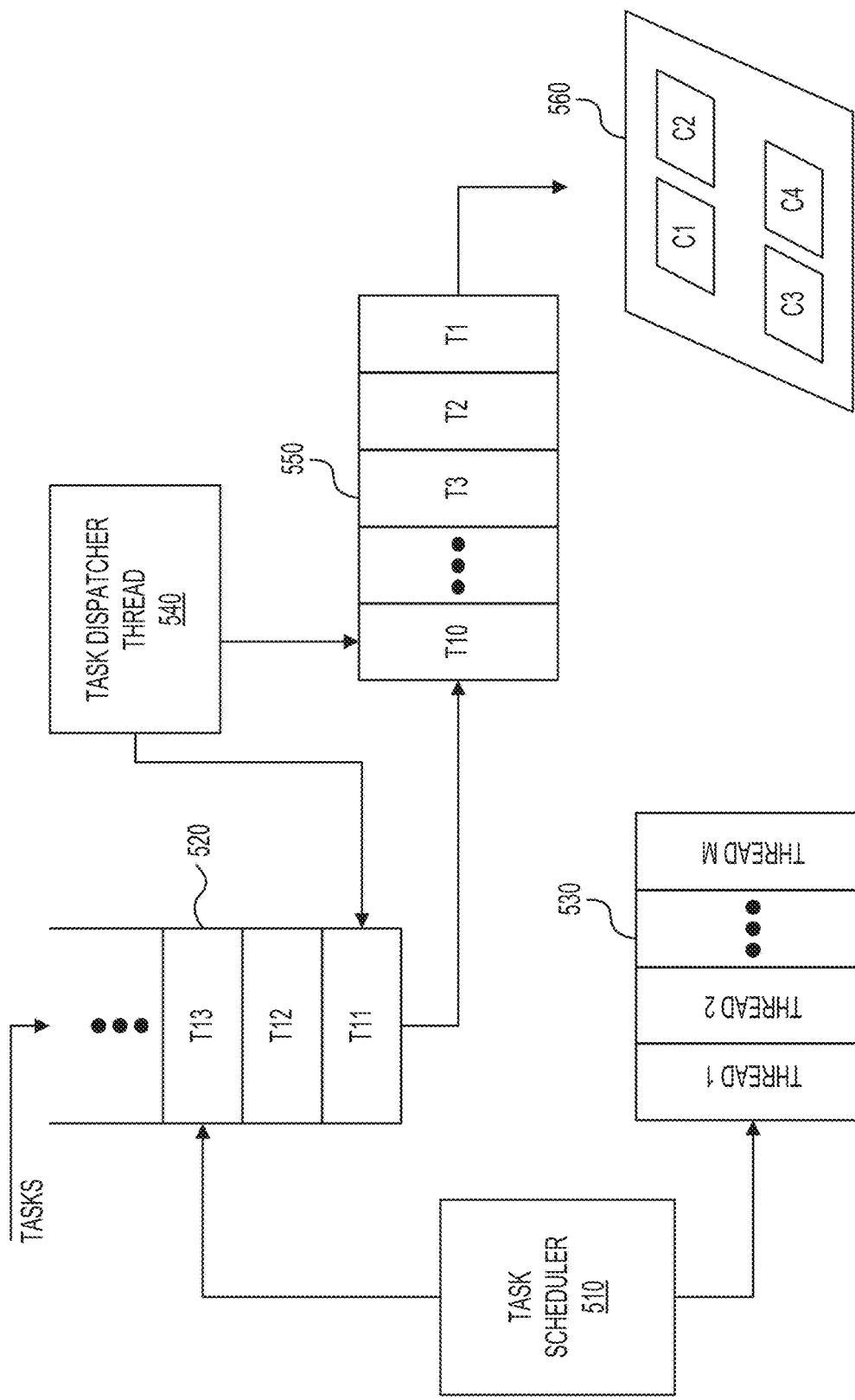
FIG. 5 shows the scheduling of place and route tasks based on the inflated areas of reach in accordance with one example.

FIG. 5 shows an arrangement 500 for the scheduling of place and route tasks based on the inflated areas of reach in accordance with one example. A task scheduler 510 may schedule the tasks for execution using resources associated with a computing platform (e.g., computing platform 200). Tasks may be queued in a queue 520. Queue 520 may be implemented as a stack, a linked list, or any other data structure for use with task scheduler 510, Threads 530 configured for execution using cores associated with a processor (e.g., processor 210 of FIG. 2) may include thread 1, thread 2, and thread M. In this example, any given thread in the system will call a function "AwaitOnArea," which takes as parameters a rectangular "area" and a callback function "operation." For the placement and routing of wires, the area may correspond to the areas of reach described earlier with respect to FIG. 4 and the callback function may correspond to a wire routing and placement operation. A new task will be created in the stack and will get assigned the "area" and the "operation." A dispatcher (e.g., task dispatcher thread 540) may dispatch threads for execution. In this example, task dispatcher thread 540 may take a snapshot of the deferred tasks that needs to be scheduled and add these tasks to a deferred list 550. Any of threads 530 may acquire the dispatcher role and process deferred list 550. Other threads may go back to wait, or process activated tasks. The processing of tasks from deferred list 550 may include transitioning one or more of these tasks into the active state so that they can be executed by any of the processing units (e.g., cores C1, C2, C3, and C4) associated with one or more processors (e.g. processor 560, which; in one example; may correspond to processor(s) 202 of FIG. 2).

Figure 6:
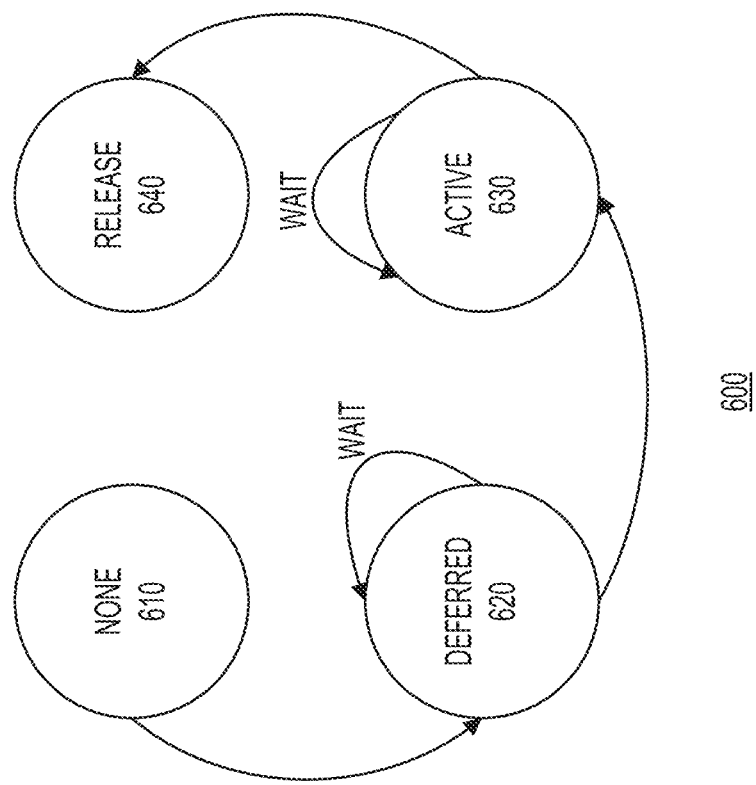
FIG. 6 is a state diagram showing states of tasks in accordance with one example.

FIG. 6 is a state diagram 600 showing states of tasks in accordance with one example. As shown in FIG. 6, each task will have multiple states through its scheduling and execution: None 610, Deferred 620, Active 630, and Release 640. When a task has the state None 610, it will change its state to Deferred 620 and will register itself into an append-only, lock-free global deferred list (e.g., queue 520), This will make the task immediately available for scheduling and processing, which; in this example, means that the current thread no longer owns its own task. The thread that just relinquished its own task will immediately wait for any task that it could perform. Deferred tasks will wait until either: a brief period has elapsed (e.g., one millisecond) or another thread (e.g., the scheduling thread) wakes the task up. A task scheduler (e.g., task scheduler 510 of FIG. 5) may allow multiple threads to transition among the states shown in FIG. 6. In one example, any thread that has been woken up or its wait time has elapsed, will try to "help" with the append-only lock-free deferred list. Table 1 below shows example pseudocode associated with the scheduling of tasks.

TABLE 1

```
Rect64 areaOfReach(0, 0, 50, 100);
auto future = AsyncOpWithArea(
  areaOfReach,
  [ ] { /* some task */ }); // non-blocking
future.get( ); // wait
```

As, in this example, the deferred list is append-only, it may be safe to take a snapshot of a certain number of tasks (e.g. 10 tasks) that are in the deferred list. In the meantime, other tasks may be appended to the append-only list (e.g., queue 520). Assuming the snapshot contains ten tasks, the new head of the deferred list will be the 11th task (or null); but, in one example, it can be set only after the current snapshot has been fully processed. In this example, task dispatcher thread 540 owns the snapshot of the deferred tasks (e.g., 10 tasks). All tasks in the snapshot are initially in the deferred state (e.g., deferred state 620 of FIG. 6).

FIGS. 7A-7F show an example of scheduling of place and route tasks based on the area of reach in accordance with one example. In this example, task dispatcher thread 540 can access the number of processing units (e.g., cores) that are in the system and can build a "batch of active tasks" out of the snapshot. In one example, if the number of cores is four, then the maximum size of the "batch of active tasks" will be four. FIG. 7A shows deferred tasks T1, T2, T3, and T4. In this example, thread 1 has acquired the role of task dispatcher thread 540. The task dispatcher thread will move all of the mutually exclusive tasks to the batch. This may be accomplished using a brute force algorithm with the complexity of the order of O(N)2, where N is the number of tasks. The performance of the brute force algorithm may be sufficient because the size of the "batch of active tasks" is relatively small (e.g., fewer than 80 active tasks), Moreover, even if the tasks are linked in the deferred list, memory prefetching can be used to reduce the frequent scanning of the brute force algorithm. Other algorithms could also be used if the size of the batch increases beyond 100.

Once a batch is full, the dispatcher thread may change the state of all the mutually exclusive tasks from the deferred state (e.g., Deferred 620) to the active state (e.g., Active 630). In this example, tasks T2, T3, and T4 have been switched to the active state (FIG. 7B). The dispatcher thread may further signal the threads that are waiting (e.g., thread 2, thread 3, and thread 4 as shown in FIG. 7C), which may start executing their respective tasks. Thus, in this example, there is one to one correspondence between a thread and a task. The dispatcher thread will repeat this process until each task in the snapshot has changed its state from the deferred state to the active state. The threads that saw their state changing from Deferred to Active will have to keep waiting until their state changes to Release. FIG. 7D shows that tasks T2, T3, and T4 have now transitioned to the release state (e.g., Release 640). This is because, in this example, the task lives in the thread's stack; thus, if a thread exits, the dispatcher thread will access an invalid memory location. The dispatcher thread will walk the snapshot of tasks and for each task, it will change their state from Active 630 to Release 640. The dispatcher thread will no longer access a task that has changed its state to Release as explained in the previous step. This will effectively "erase" the tasks and let the threads exit. The new head of the deferred list will be the next task after the last task in the snapshot. Thus, in this example, thread 3 may try to schedule task T1 by changing its state from the deferred state to the active state. However, before thread 3 can perform this action, thread 4 may change the state of task T1 to the active state. As a result, task T1, as shown in FIG. 7F, will transition to the active state.

The dispatcher thread will also check its own state to determine whether the state is Deferred or Active. If the state is Deferred, then in this example, the dispatcher thread will start traversing the array of scheduled tasks. Otherwise, if the state of the dispatcher thread is Active, it will call the "operation" callback function and then start traversing the array of scheduled tasks. Any thread with its task marked as Active will execute the tasks being sure that it does not conflict with any concurrent tasks running in the system. And then it will go back to traversing the array of scheduled tasks such that more tasks can be executed in parallel. In this example, any thread with its task marked as Release, will exit.

Apart from the scheduling of tasks in an active mode, as described earlier with respect to FIG. 5, FIG. 6, and FIG. 7A-F, tasks may be scheduled in a passive mode. In this example, the dispatcher (e.g., task dispatcher thread 540 of FIG. 5) will take a well-known list of "objects" (for example, an array of 100,000 inductors) and a function to get the "area of reach" for each object. In this example, these objects are considered immutable. The dispatcher will create a set of worker threads: one per each processing unit (e.g., a core). Thus, with respect to the arrangement shown in FIG. 5, working thread W1 may be created for core C1, working thread W2 may be created for core C2, working thread W3 may be created for core C3, and working thread W4 may be created for core C4.

The dispatcher will allocate a new array of tasks, one for each supplied object. Each task will point to their corresponding object and the function to get the "area of reach" will be called; the result will be stored in a memory allocated to the task. In this example, tasks will be linked. As an example, tasks may be linked as part of an array. In this example, the tasks are kept as small as possible, because frequent memory access operations may occur during scheduling. The dispatcher will take as input the list of linked tasks and return as output an array of "batches". A batch is an array of pointers to tasks where tasks in the batch are mutually exclusive. Each batch cannot have a size greater than the number of available cores in the system.

Dispatcher may traverse the array of tasks finding those tasks that are mutually exclusive and moving them to the current batch. Moving a task from the array to the batch is a logical operation. As each task is linked, it gets unlinked from the list of tasks as it moves to the batch without copying memory over, Once a batch is completed, additional batches may be completed.

In this example, the scheduling of tasks for execution is a lengthy process as it requires the scheduling of many tasks at once, but the advantage is faster processing once the scheduling is complete. In this example, the dispatcher will process one batch at the time. The dispatcher may take a callback function "operation" that will be called every time a task is ready to be executed. A synchronization context may be created in the stack (stored in a memory) and the synchronization context may be visible to all worker threads. The synchronization context may include the active batch and the number of outstanding tasks. The first worker thread may get notified that there is a new batch available. The dispatcher may pass the synchronization context to the worker thread. The worker thread will start immediately working on processing each task in the batch. When a task is completed, the number of outstanding tasks gets decremented. After notifying the first thread, the dispatcher checks the outstanding tasks and if it is greater than zero, it keeps notifying worker threads. In this example, the dispatcher is configured to never notify more threads than tasks in the current batch. The dispatcher waits until all tasks in the current batch have been completed before moving to the next batch.

Figure 8:
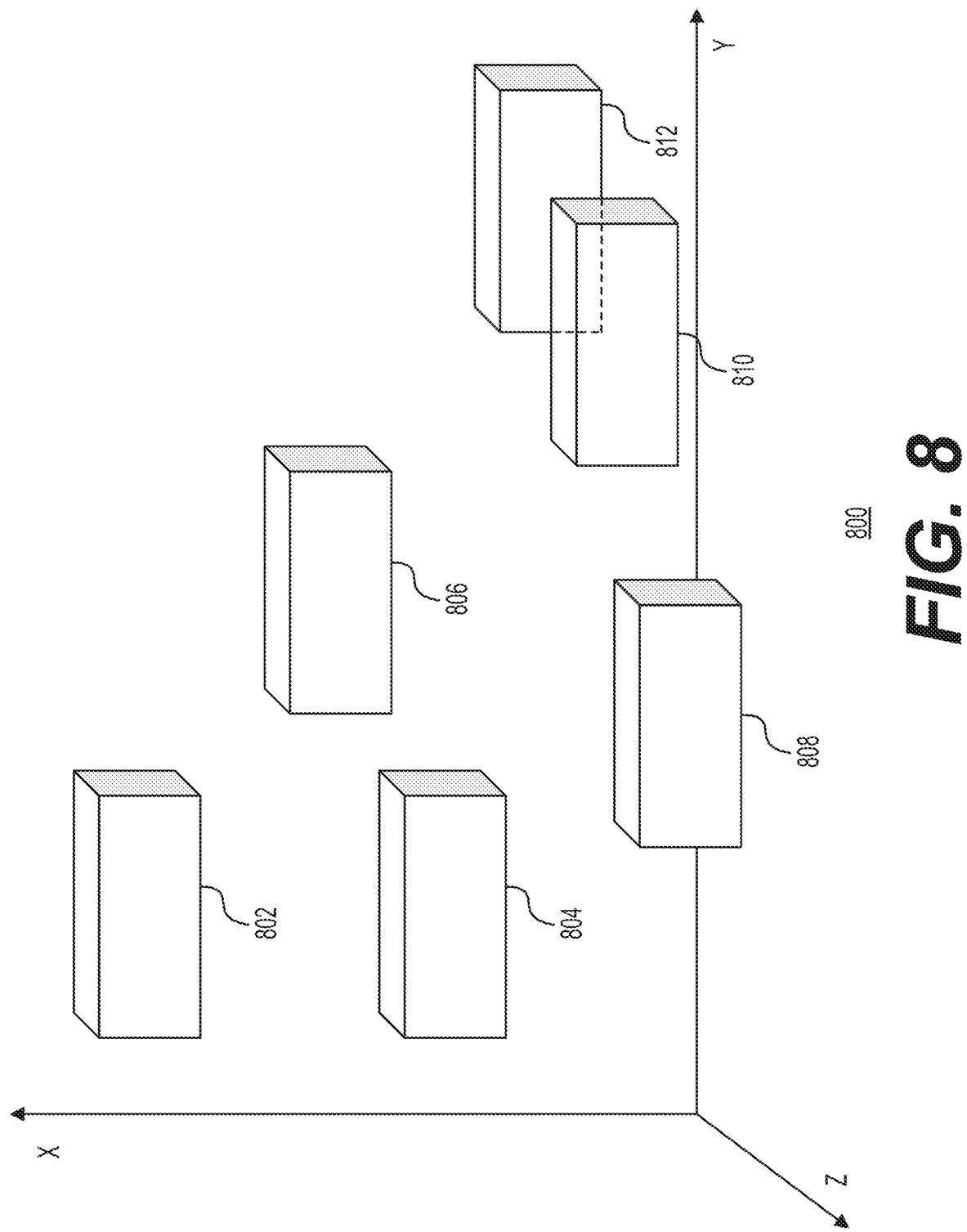
FIG. 8 shows example volumes of reach in accordance with one example.

FIG. 8 shows example volumes of reach in a shared floor plan 800 in accordance with one example. As explained earlier, the areas may have shapes corresponding to a triangle, a square, a circle, an ellipse, or a polygon with any number of sides. In addition, instead of the area, volume may be used to represent the geometric reach. Thus, in a three-dimensional space, which may represent a three-dimensional floor plan, geometric reach may correspond to the volume of a rectangle. Thus, geometric reach may be represented by volumes of reach 802, 804, 806, 808, 810, and 812. This type of geometric reach may be useful for use with multi-layer superconducting designs or those that use 3D-vias and other types of interconnecting structures that may extend in multiple dimensions and/or multiple planes.

Figure 9:
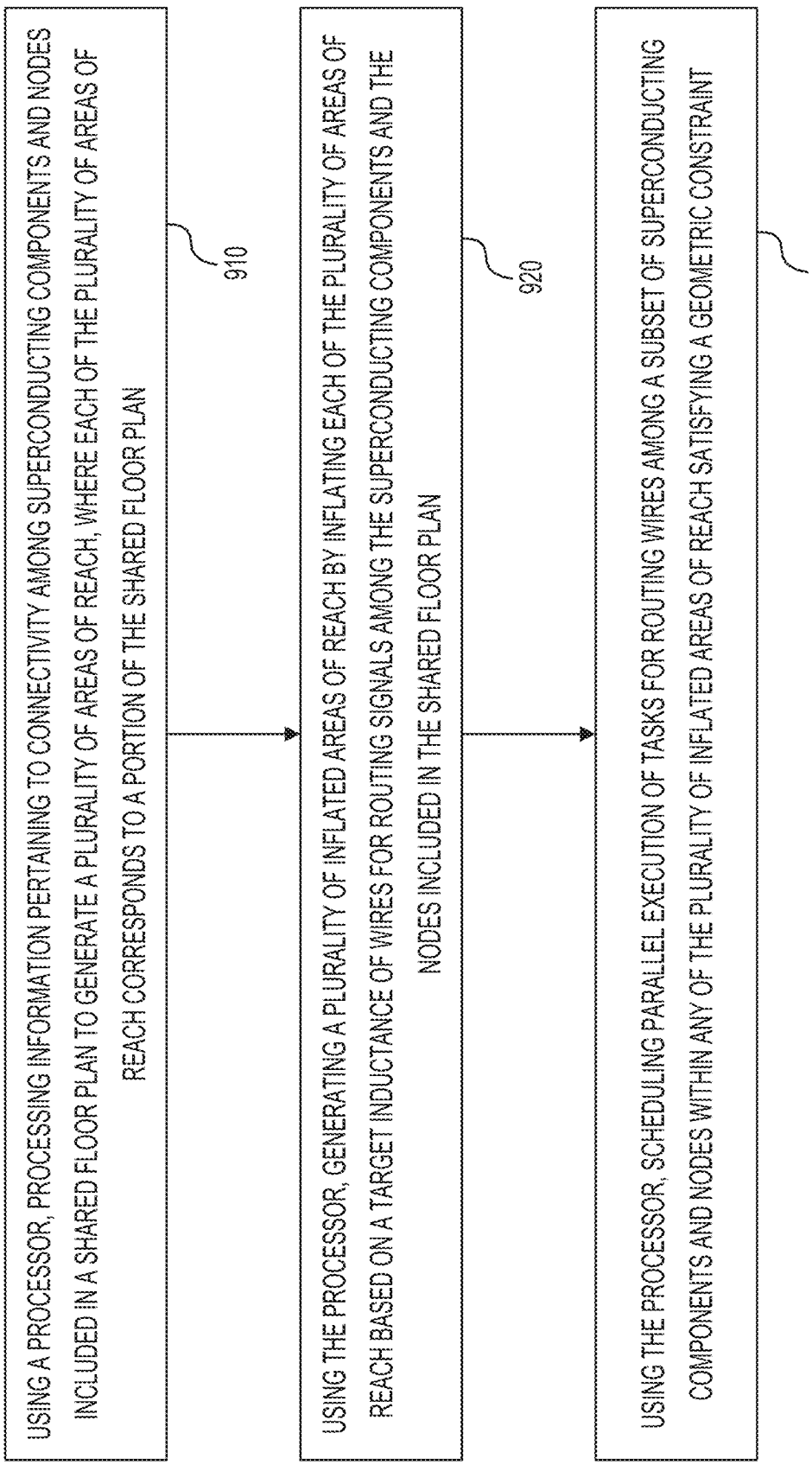
FIG. 9 is a flow chart of a method for scheduling routing tasks in parallel based on geometric reach in accordance with one example.

FIG. 9 is a flow chart 900 of a method for scheduling placement and routing tasks in parallel based on geometric reach in accordance with one example. In this example, the various steps recited as part of flow chart 900 may be performed by PRE 130, when instructions corresponding to the place and route engine are executed by a processor (e.g., processor(s) 202 of FIG. 2). Step 910 may include, processing information pertaining to connectivity among superconducting components and nodes included in a shared floor plan to generate a plurality of areas of reach, where each of the plurality of areas of reach corresponds to portions of the shared floor plan. In one example, instructions corresponding to PRE 130 of FIG. 1 in conjunction with the scheduling related components described earlier, when executed by the processor may perform this step. In this example, netlist 120 of FIG. 1 may include the connectivity related information. The areas of reach may correspond to the areas of reach shown in FIG. 4.

Step 920 may include, using the processor, generating a plurality of inflated areas of reach by inflating each of the plurality of areas of reach based on a target inductance of wires for routing signals among the superconducting components and the nodes included in the shared floor plan. In one example, instructions corresponding to PRE 130 of FIG. 1 in conjunction with the scheduling related components described earlier, when executed by the processor may perform this step. As explained earlier with respect to FIG. 4, the areas of reach may be inflated based on a target inductance. Other electrical, magnetic, or electromagnetic properties of the zero-resistance wires may also be used, as needed.

Step 930 may include, using the processor, scheduling parallel execution of tasks for routing wires among a subset of the superconducting components and the nodes within any of the plurality of inflated areas of reach satisfying a geometric constraint. In one example, instructions corresponding to PRE 130 of FIG. 1 in conjunction with the scheduling related components described earlier, when executed by the processor may perform this step. As explained earlier, the processor may include a plurality of cores (e.g., cores C1, C2, C3, and C4 of FIG. 5). Moreover, in one example, each of the areas of reach may correspond to a rectangle. In this example, the geometric constraint may be satisfied by determining whether any of the rectangles overlap. Although FIG. 9 shows a certain number of steps being performed in a certain order, the method may include more, or fewer steps performed in a different order.

Figure 10:
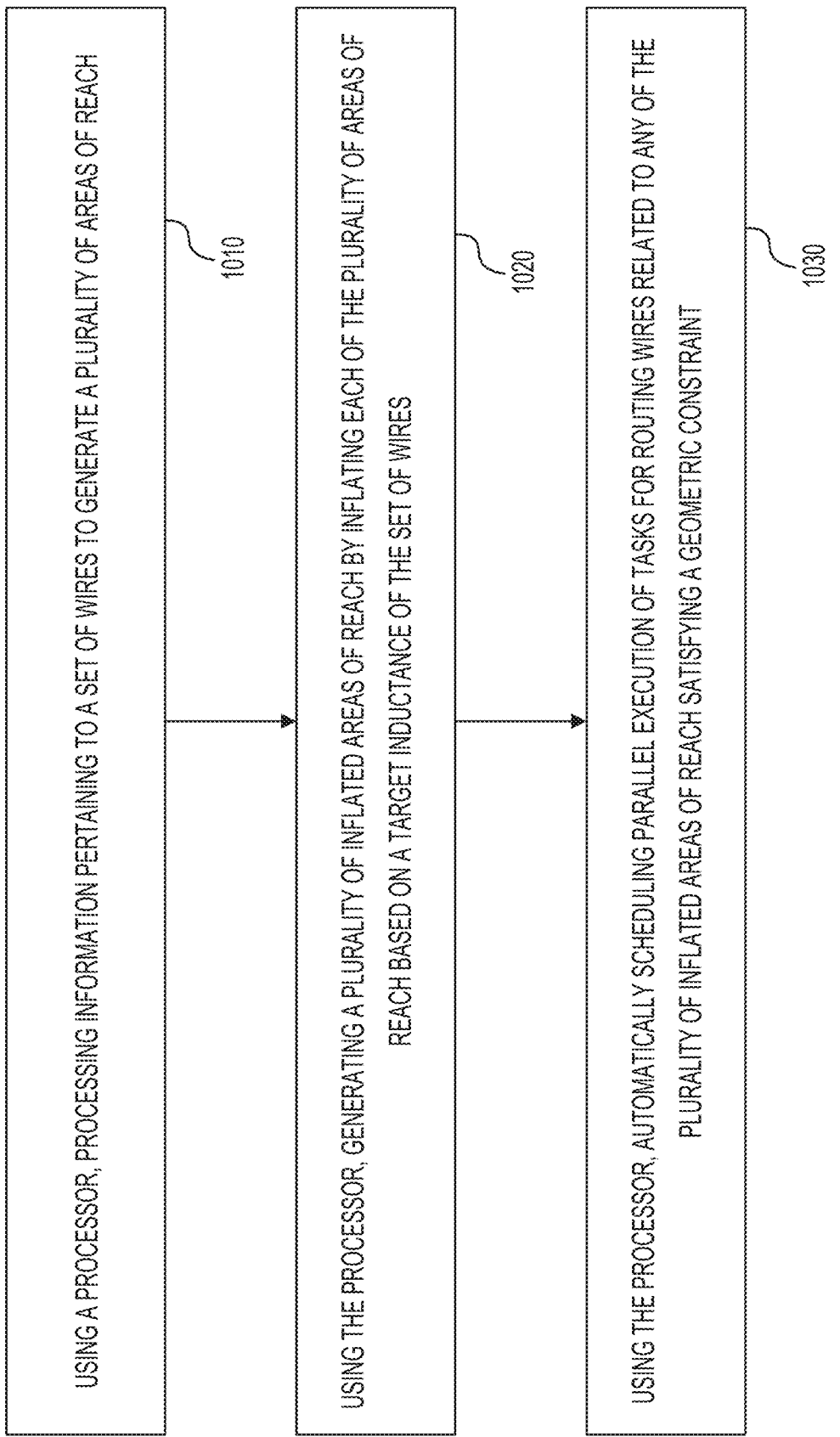
FIG. 10 is a flow chart of another method for scheduling routing tasks in parallel based on geometric reach in accordance with one example.

FIG. 10 is a flow chart 1000 of another method for scheduling placement and routing tasks in parallel based on geometric reach in accordance with one example. This example relates to the passive mode of scheduling, which is described in detail earlier. In this example, the various steps recited as part of flow chart 1000 may be performed by PRE 130, when instructions corresponding to the place and route engine are executed by a processor (e.g., processor(s) 202 of FIG. 2). Step 1010 may include using the processor, processing information pertaining to a set of wires to generate a plurality of areas of reach. In one example, instructions corresponding to PRE 130 of FIG. 1 in conjunction with the scheduling related components described earlier, when executed by the processor may perform this step. In this example, netlist 120 of FIG. 1 may include the connectivity related information. The areas of reach may correspond to the areas of reach shown in FIG. 4.

Step 1020 may include using the processor, generating a plurality of inflated areas of reach by inflating each of the plurality of areas of reach based on a target inductance of the set of wires. In one example, instructions corresponding to PRE 130 of FIG. 1 in conjunction with the scheduling related components described earlier, when executed by the processor may perform this step. As explained earlier with respect to FIG. 4, the areas of reach may be inflated based on a target inductance, Other electrical, magnetic, or electromagnetic properties of the set of wires may also be used, as needed.

Step 1030 may include using the processor, automatically scheduling parallel execution of tasks for routing wires related to any of the plurality of inflated areas of reach satisfying a geometric constraint. In one example, instructions corresponding to PRE 130 of FIG. 1 in conjunction with the scheduling related components described earlier, when executed by the processor may perform this step. As explained earlier, the processor may include a plurality of cores (e.g., cores C1, C2, C3, and C4 of FIG. 5). Moreover, in one example, each of the areas of reach may correspond to a rectangle. In this example, the geometric constraint may be satisfied by determining whether any of the rectangles overlap. Although FIG. 10 shows a certain number of steps being performed in a certain order, the method may include more, or fewer steps performed in a different order.

FIG. 11 is a flow chart 1100 of a method for scheduling tasks in parallel based on a spatial constraint in accordance with one example. Step 1110 may include processing information pertaining to a type of task to generate a plurality of areas of reach, where each of the plurality of areas of reach corresponds to portions of a shared space. In one example, the scheduling instructions may process the task related information to generate the areas of reach in a similar way as described earlier with respect to step 910 of FIG. 9. The shared space may correspond to a shared floor plan or any other type of shared space.

Step 1120 may include generating a plurality of inflated areas of reach by inflating each of the plurality of areas of reach based on a task-specific factor pertinent to the type of task. In one example, the scheduling instructions may process the task related information to generate the inflated areas of reach in a similar way as described earlier with respect to step 920 of FIG. 9. The task-specific factor may be specific to the type of task being scheduled. This factor may help ensure that even under the worst-case scenario, the tasks once scheduled can be executed in parallel.

Step 1130 may include automatically scheduling parallel execution of tasks of the type of the task related to any of the plurality of inflated areas of reach satisfying a spatial constraint. In one example, the scheduling instructions may automatically schedule parallel execution of tasks of the type of the task related to any of the plurality of inflated areas of reach satisfying a spatial constraint in a similar way as described earlier with respect to step 920 of FIG. 9. This way, a shared resource (e.g., computing resource) can be locked based on a spatial constraint rather than a generalized global lock. As an example, each of the inflated areas of reach may correspond to a rectangle; and satisfying the spatial constraint may include determining whether any of rectangles overlap. Moreover, as explained earlier, the processor may include a plurality of cores, and the scheduling instructions, when executed by the processor, may cause the processor to dispatch the scheduled tasks for execution by the plurality of cores, where each of the plurality of cores may be configured to execute at least a subset of the scheduled tasks in parallel with other tasks.

In conclusion, the present disclosure relates to a method, implemented by a processor, including using the processor, processing information pertaining to connectivity among superconducting components and nodes included in a shared floor plan to generate a plurality of areas of reach, wherein each of the plurality of areas of reach corresponds to a portion of the shared floor plan. The method may further include using the processor, generating a plurality of inflated areas of reach by inflating each of the plurality of areas of reach based on a target inductance of wires for routing signals among the superconducting components and the nodes included in the shared floor plan. The method may further include using the processor, scheduling parallel execution of tasks for routing wires among a subset of the superconducting components and the nodes within any of the plurality of inflated areas of reach satisfying a geometric constraint.

The processor may include a plurality of cores, and the method may further comprise dispatching scheduled tasks for execution by the plurality of cores, where each of the plurality of cores is configured to execute at least a subset of the scheduled tasks in parallel with other tasks. Each of the plurality of inflated areas of reach may correspond to a rectangle, and the satisfying the geometric constraint may comprise determining whether any of rectangles overlap. Inflating each of the plurality of areas of reach based on the factor associated with the target inductance of wires for routing signals may comprise expanding a reach of each of the plurality of areas in both a horizontal direction and a vertical direction.

The method may further include assigning each of the scheduled tasks to a deferred state. The processor may comprise a plurality of cores, and the method may further comprise transitioning a task from the deferred state to an active state, where in the active state a thread is assigned to execute the task using at least one of the plurality of cores. The tasks in the active state may be executed in parallel using the plurality of cores.

In another aspect, the present disclosure relates to a system comprising a processor and a memory having instructions. The instructions, when executed by the processor, may cause the processor to: (1) process information pertaining to a type of task to generate a plurality of areas of reach, wherein each of the plurality of areas of reach corresponds to a portion of a shared space; (2) generate a plurality of inflated areas of reach by inflating each of the plurality of areas of reach based on a task-specific factor pertinent to the type of task; and (3) automatically schedule parallel execution of tasks of the type of the task related to any of the plurality of inflated areas of reach satisfying a spatial constraint.

The processor may comprise a plurality of cores, and the instructions, when executed by the processor, may cause the processor to dispatch scheduled tasks for execution by the plurality of cores, where each of the plurality of cores is configured to execute at least a subset of the scheduled tasks in parallel with other tasks. Rach of the plurality of inflated areas of reach may correspond to a rectangle, and the satisfying the spatial constraint may comprise determining whether any of rectangles overlap.

The memory may further comprise instructions; when executed by the processor, may cause an assignment of each of the scheduled tasks to a deferred state. The processor may comprise a plurality of cores, and the memory may further comprise instructions, when executed by the processor, may cause a transition of a task from the deferred state to an active state, where in the active state a thread is assigned to execute the task using at least one of the plurality of cores.

The tasks in the active state may be executed in parallel using the plurality of cores. The type of task may comprise a routing task for routing zero-resistance wires, and the task-specific factor may comprise a target inductance associated with the zero-resistance wires.

In yet another aspect, the present disclosure relates to a method, implemented by a processor, for use with a set of wires for routing signals as part of a superconducting circuit design. The method may further include using the processor, processing information pertaining to the set of wires to generate a plurality of areas of reach. The method may further include using the processor, generating a plurality of inflated areas of reach by inflating each of the plurality of areas of reach based on a target inductance of the set of wires. The method may further include using the processor, automatically scheduling parallel execution of tasks for routing wires related to any of the plurality of inflated areas of reach satisfying a geometric constraint.

The method may further include creating a synchronization context visible to any threads configured to execute the tasks. The synchronization context may include information concerning active batches of tasks and information concerning outstanding tasks.

Each of the plurality of inflated areas of reach may correspond to a rectangle, and the satisfying the geometric constraint may comprise determining whether any of rectangles overlap. The set of routing wires may comprise superconducting wires having zero resistance. The superconducting circuit design may comprise a first shared floor plan corresponding to a first layer and a second shared floor plan corresponding to a second layer, and the method may further comprise automatically scheduling parallel execution of tasks for routing superconducting wires and vias to interconnect a first set of superconducting components in the first shared floor plan and a second set of superconducting components in the second shared floor plan.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory, such as DRAM, SRAM, a cache, or other such media. Non-transitory media is distinct from, but can be used in conjunction with, transmission media. Transmission media is used for transferring data and/or instruction to or from a machine, such as processor(s) 402. Example transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A method, implemented by a processor, comprising:
   using the processor, processing information pertaining to connectivity among superconducting components and nodes included in a shared floor plan to generate a plurality of areas of reach, wherein each of the plurality of areas of reach corresponds to a portion of the shared floor plan;
   using the processor, generating a plurality of inflated areas of reach by inflating each of the plurality of areas of reach based on a target inductance of wires for routing signals among the superconducting components and the nodes included in the shared floor plan; and
   using the processor, scheduling parallel execution of tasks for routing wires among a subset of the superconducting components and the nodes within any of the plurality of inflated areas of reach satisfying a geometric constraint.

2. The method of claim 1, wherein the processor comprises a plurality of cores, and the method further comprises dispatching scheduled tasks for execution by the plurality of cores.

3. The method of claim 2, wherein each of the plurality of inflated areas of reach corresponds to a rectangle.

4. The method of claim 3, wherein the satisfying the geometric constraint comprises determining whether any of rectangles overlap.

5. The method of claim 2, wherein each of the plurality of cores is configured to execute at least a subset of the scheduled tasks in parallel with other tasks.

6. The method of claim 1, wherein inflating each of the plurality of areas of reach based on the factor associated with the target inductance of wires for routing signals comprises expanding a reach of each of the plurality of areas in a horizontal direction.

7. The method of claim 1, further comprising assigning each of the scheduled tasks to a deferred state.

8. The method of claim 7, wherein the processor comprises a plurality of cores, and the method further comprises transitioning a task from the deferred state to an active state, wherein in the active state a thread is assigned to execute the task using at least one of the plurality of cores.

9. The method of claim 8, wherein tasks in the active state are executed in parallel using the plurality of cores.

10. The method of claim 1, wherein inflating each of the plurality of areas of reach based on the factor associated with the target inductance of wires for routing signals comprises expanding a reach of each of the plurality of areas in a vertical direction.

11. A method, implemented by a processor, for use with a set of wires for routing signals as part of a superconducting circuit design, the method comprising:
    using the processor, processing information pertaining to the set of wires to generate a plurality of areas of reach;
    using the processor, generating a plurality of inflated areas of reach by inflating each of the plurality of areas of reach based on a target inductance of the set of wires; and
    using the processor, automatically scheduling parallel execution of tasks for routing wires related to any of the plurality of inflated areas of reach satisfying a geometric constraint.

12. The method of claim 11, further comprising creating a synchronization context visible to any threads configured to execute the tasks.

13. The method of claim 12, wherein the synchronization context includes information concerning active batches of tasks and information concerning outstanding tasks.

14. The method of claim 11, wherein each of the plurality of inflated areas of reach corresponds to a rectangle, and wherein the satisfying the geometric constraint comprises determining whether any of rectangles overlap.

15. The method of claim 11, wherein the set of outing wires comprises superconducting wires having zero resistance.

16. The method of claim 15, wherein the superconducting circuit design comprises a first shared floor plan corresponding to a first layer and a second shared floor plan corresponding to a second layer, and the method further comprising automatically scheduling parallel execution of tasks for routing superconducting wires and vias to interconnect a first set of superconducting components in the first shared floor plan and a second set of superconducting components in the second shared floor plan.

17. A non-transitory storage medium comprising instructions corresponding to a method, implemented by a processor, the method comprising:

using the processor, processing information pertaining to connectivity among superconducting components and nodes included in a shared floor plan to generate a plurality of areas of reach, wherein each of the plurality of areas of reach corresponds to a portion of the shared floor plan;

using the processor, generating a plurality of inflated areas of reach by inflating each of the plurality of areas of reach based on a target inductance of wires for routing signals among the superconducting components and the nodes included in the shared floor plan; and using the processor, scheduling parallel execution of tasks for routing wires among a subset of the superconducting components and the nodes within any of the plurality of inflated areas of reach satisfying a geometric constraint.

18. The non-transitory storage medium of claim 17, wherein the processor comprises a plurality of cores, and the method further comprises dispatching scheduled tasks for execution by the plurality of cores, wherein each of the plurality of cores is configured to execute at least a subset of the scheduled tasks in parallel with other tasks.

19. The non-transitory storage medium of claim 18, wherein each of the plurality of inflated areas of reach corresponds to a rectangle, and wherein the satisfying the geometric constraint comprises determining whether any of rectangles overlap.

20. The non-transitory storage medium of claim 17, wherein inflating each of the plurality of areas of reach based on the factor associated with the target inductance of wires for routing signals comprises expanding a reach of each of the plurality of areas in both a horizontal direction and a vertical direction.

* * * * *